United States Patent [19]

Hagelstein et al.

[11] Patent Number: 4,873,439

[45] Date of Patent: Oct. 10, 1989

[54] X-RAY DETECTOR

[75] Inventors: Peter L. Hagelstein, Acton; Cristopher C. Eugster, Cambridge, both of Mass.

[73] Assignee: Massachusetts Institute of Technology, Cambridge, Mass.

[21] Appl. No.: 211,776

[22] Filed: Jun. 27, 1988

[51] Int. Cl.[4] .............................................. G01T 1/00
[52] U.S. Cl. .............................. 250/327.2; 250/336.1; 250/370.09; 350/353; 357/4; 357/29
[58] Field of Search ................... 250/327.2 L, 370.09, 250/336.1; 357/4 SL, 29; 350/353

[56] References Cited

U.S. PATENT DOCUMENTS

| 3,555,455 | 1/1971 | Paine | 372/26 |
| 4,070,621 | 1/1978 | Bassen et al. | 324/96 |
| 4,561,005 | 12/1985 | Shannon | 357/24 |
| 4,688,068 | 8/1987 | Chaffin et al. | 357/30 |
| 4,731,641 | 3/1988 | Matsushima et al. | 357/30 |

FOREIGN PATENT DOCUMENTS 59-116612 7/1984 Japan .............................. 357/4 SL

OTHER PUBLICATIONS

H. Haug & S. Schmitt-Rink, "Basic Mechanisms of the Optical Nonlinearities of Semiconductors Near the Band Edge", (Feb., 1985), *J. Optical Society of America B*, pp. 1135–1142.

J. L. Jewell, "3–pJ, 82–MHz Optical Logic Gates in a Room–Temperature GaAs–AlGaAs Multiple-Quantum–Well Étalon", (Feb., 1985), *Appl. Phys. Lett.*, 46 (10), pp. 918–920.

N. Peyghambarian & H. M. Gibbs, "Optical Nonlinearity, Bistability, and Signal Processing in Semiconductors", (Apr., 1985), *J. Optical Society of America B, pp. 1215–1227.*

A. G. Milnes, "Impurity and Defect Levels (Experimental) in Gallium Arsenide", (1983), Advances in Electronics & Electron Physics, vol. 61, pp. 63–160.

*Primary Examiner*—Constantine Hannaher
*Attorney, Agent, or Firm*—Hamilton, Brook, Smith & Reynolds

[57] ABSTRACT

X-ray detection systems based upon the nonlinear optical properties of multiple quantum well (MQW) semiconductor structures is described. X-rays generate carriers which change the index of refraction of the MQW material. Light from a probe beam may be scattered or reflected off the MQW structure and modulated by the change in refractive index caused by the carriers generated by the incident x-ray photons. A planar and microetalon approach is illustrated.

15 Claims, 2 Drawing Sheets

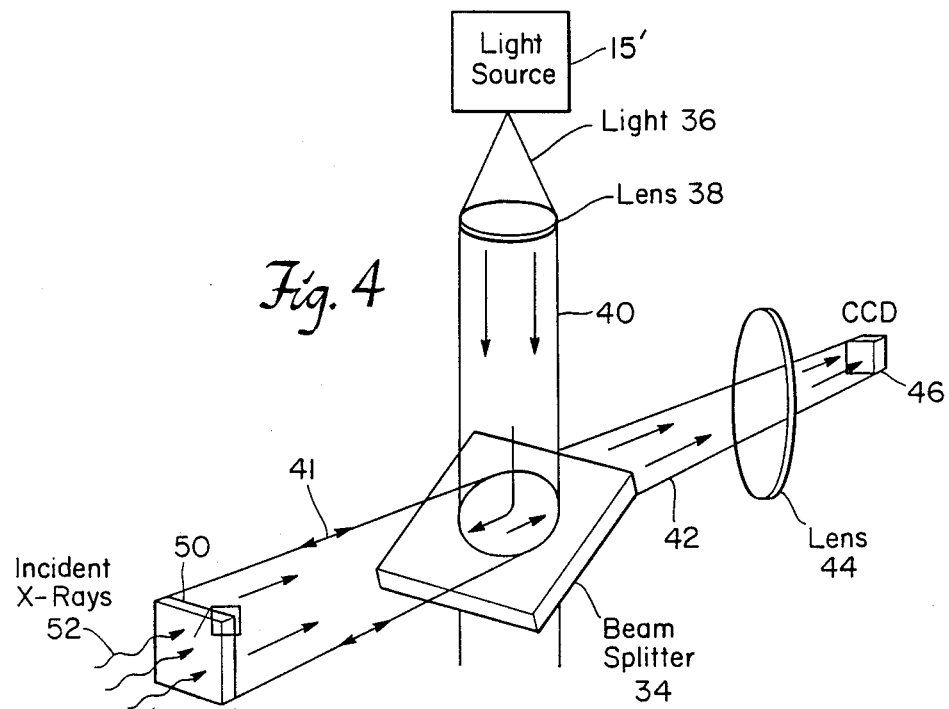
*Fig. 4*
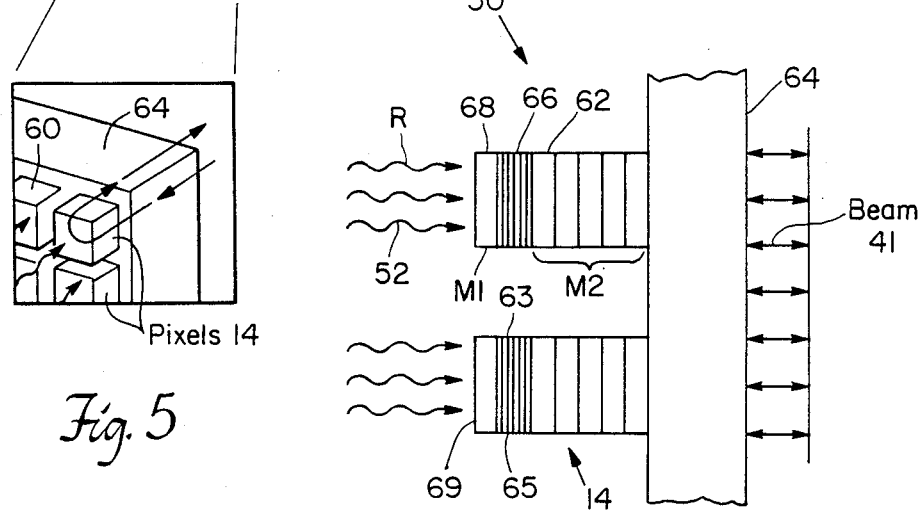
*Fig. 5*
*Fig. 6*

X-RAY DETECTOR

BACKGROUND OF THE INVENTION

The recent development of short wavelength lasers in the soft (about 50 to 100 eV) x-ray regime (about 124 Å to 248Å) has brought a need for time-resolved and time-gated detectors which are both efficient and have good spatial resolution. Applications for such detectors include time-gated spectrometers and cameras for the soft x-ray laser beam, diagnostics for the plasma amplifiers, and imaging instruments for microscopic and holographic applications.

Presently, gated x-ray detectors are based on microchannel plate technology. The spatial resolution of microchannel plate detectors is limited by fiber diameter to tens of microns, and the temporal resolution is in the vicinity of 100–200 psec (M.J. Eckart, R. L. Hanks, J. D. Kilkenny, R. Pasha, J. D. Wiedwald and J. D. Hares, "Large-Area 200-ps Gated Microchannel Plate Detector", Rev. Sci. Instrum., 57, 1986). Microchannel plate detectors have efficiencies of 5–15% in the soft x-ray regime depending upon the wavelength of the incident photons and the angle of incidence (G. W. Fraser, "The Soft X-ray Quantum Detection Efficiency of Microchannel Plates", Nuclear Instruments and Methods, 195, pp. 523-538, 1982; J. L. Wisa, "Microchannel Plate Detectors", *Nuclear Instruments and Methods*, 162, pp. 587-601, 1979).

DISCLOSURE OF THE INVENTION

The present invention relates to the use of optical nonlinearities of quantum wells (QW) or multiple quantum well (MQW) structures to obtain potentially fast (10 psec) and efficient x-ray detectors with very high (1 μ) spatial resolution.

Quantum wells are formed when the thickness of the narrow energy gap layer in heterostructures is sufficiently small such that effects associated with the quantization of confined carriers are observed. Such ultra-thin (<10nm) heterostructures may be either quantum well structures or superlattices, depending upon the degree of barrier layer thickness $L_b$ and the degree of wave function penetration depth $L_p$ into the barrier. In quantum wells $L_b >> L_p$ so that the wave function of adjacent wells does not overlap; whereas in superlattices $L_b << L_p$ and interaction is promoted.

In the apparatus of the present invention, an x-ray detector is provided comprising, in general, a substrate upon which is provided, successively, a quantum well structure, an optical separator structure and a converter structure. Incident x-rays impinging on the converter structure penetrate a predetermined depth. The depth of penetration depends upon the converter material and the energy of the x-ray photon. In GaAs, the depth is about 200-300 Å for a 100 eV photon. In the penetration process, high energy carriers are generated through inner-shell photoionization and Auger ionization of the converter structure material. A small scale collisional avalanche follows as one carrier collides with nearby atoms, donors, or acceptors, producing more carriers from the high energy carriers initially generated. This avalanche generation process is enhanced by providing donor and acceptor impurities in the converter region.

The generated carriers diffuse across an optional separator structure formed of a semiconductor or insulator material, such as GaAs, which may be provided to allow for added thermalization, i.e., cooling of the carriers. The diffused carriers then enter into a quantum well structure formed of, for example, GaAs, changing the carrier density within the quantum well structure in proportion to the energy of the impinging x-ray photons. The carriers generated by the x-ray photons are highly localized. Likewise, the avalanche generated carriers which diffuse across the separator structure remain highly localized. Hence, the carrier density remains very large. A corresponding large change in the refractive index of the quantum well structure occurs due to the large change in carrier density. This refractive index change is used to detect the x-ray beam in either of two embodiments, a planar detection system or a microetalon detection system.

In the planar system, an optical beam is incident on the detector and scattered by the perturbations in refractive index due to the carrier density changes in the quantum well. The scattering is due to the localization of the perturbations. In the microetalon system, the optical beam is reflected from an array of multiple quantum wells formed between two mirrors creating a Fabry Perot cavity. The cavities are isolated from one another to form pixels. A phase change in the light propagated in each pixel is induced by the change in refractive index of the multiple quantum well material caused by incident x-ray photons. This phase change causes a light beam intensity change of the beam reflected from each pixel. In both cases, the modulations induced on the optical beam are sensed and displayed to produce a time resolved image of the x-ray distribution at the surface of the converter structure of the detector.

BRIEF DESCRIPTION OF THE DRAWINGS

FIG. 4 is a three dimensional depiction of the x-ray detector in a pixel or etalon embodiment.

FIG. 5 is an enlarged view of the quantum well structure showing the protruding pixels.

FIG. 6 is a schematic depiction of a pair of pixels.

DETAILED DESCRIPTION OF THE INVENTION

I. General Description

In the apparatus and method of the invention, carriers are produced through direct absorption of x-rays near the surface of a semiconductor body. The carriers can, in principle, lead to weak modulation of an optical probe beam directed at the body. The basic effect is proportional to the number of carriers produced following the absorption of a single soft x-ray photon. This effect becomes more prevalent as the x-rays become more energetic defining a detection range that the device can operate within.

Two embodiments will be described which take advantage of the carrier generation effect in order to allow detection of a single soft x-ray photon. In the first embodiment, a homogeneous MQW structure is used, and detection is based on wide-angle scattering of the optical probe from a local disturbance in the (complex)

index of refraction produced by a single photon. The second approach uses microetalons with high cavity finesse (high Q) to enhance the effects of small changes in refractive index. In this system, the microetalons are arranged such that the reflectivity is increased by a detectable amount following the absorption of a soft x-ray photon.

Figure 1:
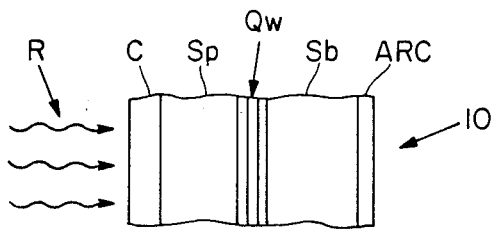
FIG. 1 is a schematic illustrating the different layers of material in the quantum well structure QW of a detector in accordance with the invention.

FIG. 1 shows a cross-section of the basic detector detector structure 10. The dimensions of the quantum structure detectors may be roughly 3 mm by 3 mm with a depth in the range of 1 micron, or less, excluding the substrate thickness.

As shown in FIG. 1, an incident soft (100 eV) x-ray 20 penetrates approximately 200–300 Å into the front surface of the converter region C of a semiconductor or insulator structure where it generates high energy carriers which are highly localized, i.e., confined to a small volume. The carriers are generated through inner-shell photoionization and Auger ionization of the atoms of the converter semiconductor material. Such material may comprise a layer of semiconductor high bandgap material, such as AlGaAs. A highly localized small-scale collisional avalanche results from the initial carrier generation since essentially all of the initial, very hot carriers have sufficient energy to ionize outer shell electrons of the neutral lattice within the converter C. This process happens very rapidly, in less than one picosecond.

This process can be enhanced through the placement of donor and/or acceptor impurities in the converter region C. In the absence of impurities, energy, equal to the bandgap energy plus losses, is expended on each of the electron-hole pairs which are created. The number of carriers created corresponds to the ratio of photon energy to effective gap energy. The effective gap energy consists of the ionizing energy, the residual kinetic energy of the carriers after they are no longer able to collisionally ionize the atoms, and the optical phonon losses which result from momentum losses to lattice vibrations. (See Klein, C.A., "Bandgap Dependence and Related Features of Radiation Ionization Energies in Semiconductors", *J. Appl. Phys.*, 39, 1968.) If donor and acceptor impurities are present in the converter region, and if the impurities are sufficiently deep to contribute an extrinsic carrier density which is small at the operating temperature in comparison to the signal carrier density generated by the soft x-ray photon, then the impurities will dominate the soft x-ray to carrier conversion process. Under such conditions, a substantial increase in the number of carriers can be obtained. For less energetic photons ($\leq 100$ eV), the device should be operated at liquid nitrogen temperatures 77° K., so that the donors can reside at shallow energy levels. For example, if the depth of the impurity levels is 0.05 eV (and the corresponding impurity doping level is $2.5 \times 10^{18}$ dopant/cm$^3$), then, in principle, as many as 500 carriers could be produced following the absorption of a single 100 eV photon.

Suitable donor and/or acceptor impurities may comprise oxygen, beryllium, or chromium. Such impurities may be provided by a vapor phase epitaxy process. As an alternate to creation of impurities, a similar effect may be obtained by creating lattice defects, such as El or EL-2.

The carriers generated in the converter region diffuse across an optional separator region Sp. This region may be required to allow for additional thermalization of the carrier. The separator region Sp may also comprise semiconductor material or insulator material. After the carriers pass through the separator region, they enter into the quantum-well or multiple quantum wells region where their effects on the index of refraction in that region becomes important. The quantum well(s) structure may be comprised of an insulator or semiconductor structure, such as alternate layers of GaAs and AlGaAs. The effect of carrier density on optical constant is strongest in the vicinity of the exciton photo-absorption lines just below the bandgap of the material (near 1.45 eV for GaAs at 300K). The lineshapes of the exciton absorption consist of two main lines due to heavy and light absorption. These lines are sensitive to carrier density (as a result of Coulomb screening). The change in refractive index caused by the influx of carrier is described by:

$$\Delta n = p' N_{eh} \qquad \text{Equation 1}$$

where p' is the excess density of carriers in the quantum well QW due to the absorption of the incident photon. (NOTE: It is assumed that the extrinsic background carrier density is small and not localized.) $N_{eh}$ is the change in refractive index produced by one electron-hole pair per unit volume. The change in index "$\Delta n$" creates enough of a change in material homogeneity that an optical probe beam focused on the quantum well will be modulated. These modulations can be detected in the scattered light (in the planar detector embodiment) or reflected light (in the microetalon embodiment). In Equation 1, and in the discussion that follows, the index change $\Delta n$ is complex. Also $N_{eh}$ is considered to be complex. The imaginary part of $N_{eh}$, i.e., Im $N_{eh}$ = $_{eh}/2k_o$, where $k_o$ is the free space propagation constant.

Two methods are available for sensing the carrier-mediated soft x-ray/optical nonlinearity. If the optical probe is tuned to the long wavelength knee of the absorption curve, then little absorption occurs in the absence of soft x-ray produced carriers. In this case, the soft x-ray signal is imprinted through attenuation in the optical probe beam. Alternatively, the optical probe may be tuned to the peak of the exciton absorption curve. Since the presence of carriers reduces the peak optical absorption, the soft x-ray signal is imprinted through a lack of attenuation (enhancement compared to the signal from non-irradiated surface) in the optical probe beam. Both methods are contemplated in the embodiments hereinafter described.

The number of carriers $N_c$ produced by a single soft x-ray photon is sufficient to cause lineshape modification if a major fraction of them are trapped within a single quantum well and localized within a small radius. For example, 500 carriers trapped within a 100 Å quantum well at 0.5 Å radius corresponds to a local density of $6.4 \times 10^{16}$ carriers/cm$^3$. The largest magnitude of $N_{eh}$ occurs near the peak of the lowest exciton absorption line, and is approximately $3.7 \times 10^{-19}$ cm$^{-3}$. As a result, a modulation of the real part of the index of refraction of $2.4 \times 10^{-2}$ is possible.

The imaginary part of the index of refraction corresponds to absorption, and the maximum change in absorption is estimated to be $(7.0 \times 10^{11}$ cm$^2)$ 33 $(6.4 \times 10^{16}$/cm$^3) \times °(100 \text{ A}) = 4.5 \times 10^{-3}$ in the vicinity of the absorbed soft x-ray photon. By way of contrast, a total absorption of $1.25 \times 10^4$ cm$^{-1} \times 100$ Å = $1.25 \times 10^{-2}$ occurs in a non irradiated surface. These estimates indicate that a relatively small number of localized carriers can provide a sufficiently large density to cause large lineshape modification.

If the optical probe beam is tuned to just below the long wavelength part of the lower (heavy hole) absorption line, then the modification in optical constant due to carrier concentration is weaker. Nevertheless, this regime offers the possibility of providing a large enhancement in the number of carriers present through an avalanche mechanism. For example, the exciton absorption lines arise from the process by which an electron and hole are created into an excitonic state. If the absorption coefficient is greater in the presence of soft x-ray produced carriers, then the optical probe causes a larger production rate of excitons (and hence carriers, since the excitons ionize readily). This, in turn, leads to a still larger production rate of excitons due to the presence of the new carriers.

In the vicinity of 1.45 eV, for GaAs, the primary exciton absorption coefficient is somewhat less than 500 $cm^{-1}$. The incremental absorption coefficient due to the presence of $6.4 \times 10^{16}$ carriers/$cm^3$ is close to 1100 $cm^{-1}$. Therefore, reasonable probe beam intensities from, for example a laser, in the order of 20 $\mu J/cm^2$ would significantly increase the number of carriers in the neighborhood of the incident soft x-ray photon. On the other hand, carriers generated by primary exciton creation in non-irradiated sectors would, in general, not lead to significant noise in the system due to the absence of localization.

By avalanche production, sufficient carriers may be created to fill up more than one quantum well. The first quantum well would have to be made "lossy" to allow tunneling of carriers to the second quantum well, etc. This condition is satisfied by reducing the barrier thickness ($L_b$) between quantum wells to about 30 Å. In this manner, the system could be extended from a single quantum well structure to a multiple quantum well structure, resulting in a larger reflected or scattered optical signal.

II. Soft X-Ray Detection Using Planar Structures

In the planar detection system (depicted schematically in FIG. 2), an optical probe beam, or reference beam RB, is scattered by perturbations in the complex index of refraction of MQW's due to carriers generated in converter section C through the absorption of incident soft x-ray photons R. These carriers are thermalized in separator Sp while diffusing into MQW. Localized index of refraction perturbations tend to cause scattering of the light beam at wide angles, if they are of the same order as the wavelength of the optical probe beam. Localized groups of carriers tend to rapidly disperse through diffusion. Therefore, observation of wide angle scattered optical radiation of the short (10-20 psec) optical probe pulse can provide a time-resolved image of the soft x-ray distribution at the semiconductor surface.

Figure 2:
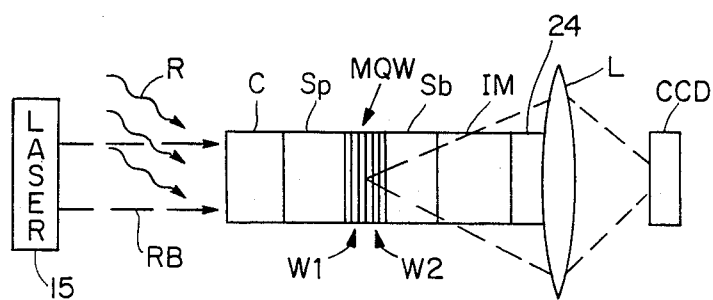
FIG. 2 is a schematic showing a planar detector embodiment of the invention.

The detailed operation of the detector of Fig. 2 is as follows; A soft x-ray photon from rays R is absorbed in the converter region C and localized carriers are generated. The carriers diffuse across separator region Sr and a moderate fraction are trapped in a first well W1 of multiple quantum wells MQW. Carriers in quantum well W1 tunnel to well W2 and more carriers fill up well W1. An optical probe beam, or reference beam RB, generated by laser light source 15 generates more carriers through an avalanche mechanism. This mechanism occurs preferentially in the vicinity of the incident energetic x-ray photon, provided the photon has arrived recently enough such that the local carrier density remains high enough to modify the exciton photoabsorption lineshape.

The resulting carrier distribution is spatially localized to within a diffusion length of the site of the initial energetic photon absorption and therefore causes moderate to wide angle scattering of the optical probe beam RB at the MQW. This scattered light is then collected by a lens L, while the remainder of the probe beam RB is eliminated with a beam stop 24, taking advantage of the narrow angular dependence of the unscattered beam. The beam stop 24 may comprise a mirror at a 45° angle to the reference beam and is preferably incorporated in lines L. A lens, which is index matched to the MQW material, is disposed between the stop 24 and the MQW. The scattered light is imaged by lens L onto an imaging device, such as a CCD 26. Improved discrimination between the probe beam and scattered signal can be obtained by focusing the probe beam to a point at the lens plane. This reduces the amount of unscattered probe beam, which misses the stop 24.

Figure 3:
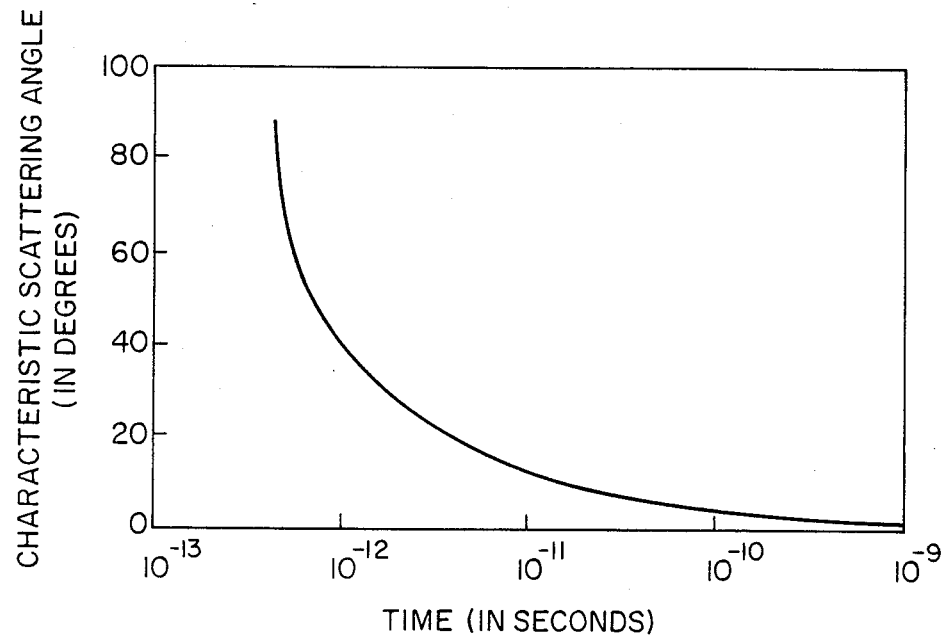
FIG. 3 is a graph depicting the characteristic angle in degrees of scattering from gaussian perturbations as a function of time in seconds.

The transverse spatial profile of the carriers within the quantum wells is time-dependent (the carriers relax by diffusion), and the corresponding angular profile of the scattered optical radiation is therefore time-dependent as well. Since strong localization gives rise to wide angular divergence, the profile of the scattered radiation will have substantial energy at wide angles early on in time and will narrow as the carrier distribution relaxes. The time dependence of the average scattering angle is shown in FIG. 3, from which it may be observed that if collection of the scattered light is limited to angles greater than 30° within the semiconductor, then the time response can be roughly 10 psec. The realization of a detector with such a large (internal) cutoff angle requires some means to avoid the problem of total internal reflection, such as adding an anti-reflection coating ARC to the back side of the substrate Sb, as in FIG. 1.

It should be noted that the MQW structure does not have to be formed directly on the substrate Sb. Preferably, the MQW is formed on a lattice compatible substrate, i.e., GaAs. MQW's are then formed by metalorganic chemical vapor deposition (MOCVD), or other compatible process, on the GaAs substrate. Then a GaAs separator structure is formed over the MQW by MOCVD. The GaAs substrate is then removed and the GaAs/AlGaAs MQW and separator are bonded to a light transparent substrate structure, such as glass or quartz.

III. Theoretical Model of Planar Embodiment

A simple model may be postulated to describe the scattering from the localized carriers trapped in the quantum wells. The model consists of a probe beam which is incident upon a localized perturbation of the propagation constant in the quantum well(s) $\delta k$ (which is space- and time-dependent), and which scatters the incident light. This simple model does not include the transmission of the scattered radiation through the semiconductor - antireflection coating - free space interface which will be present in an implementation of the system. Rather, in this simplified problem, the region between the substrate and collecting lens is a perfectly indexed matched medium with an index of refraction identical to that of the substrate. This assumption considerably simplifies the analytic considerations and allows a relatively simple closed form expression for the scattered intensity.

Wide angle scattering of the reference beam (under the assumptions of the model as described above) can be modeled perturbatively by the Helmholtz equation through:

$$\nabla^2 E_s + K^2 E_s = 2K \, \delta K E_i \qquad \text{Equation 2}$$

where $E_i$ is the field strength of the incident optical probe beam RB and $E_s$ is that of the scattered light SL. The propagation constant in the semiconductor k, and the perturbation of that constant $\delta k$ is given in terms of the perturbed refractive index $\Delta n$ as:

$$\delta K = K_o \Delta n \qquad \text{Equation 3}$$

$\Delta n$ is defined in Equation 1.

Equation 2 can be solved approximately using the Green's function in cylindrical coordinates, resulting in:

$$E_s(\rho, z, \phi) = \qquad \text{Equation 4}$$

$$\frac{2k}{4\pi} \int_0^R d\rho_s \rho_s \int_0^{\Delta z_s} dz_s E_i \delta k(\rho_s, z_s, t)$$

$$\int_0^{2\pi} d\phi_s \frac{e^{ik[(\rho\cos\phi - \rho_s\cos\phi_s)^2 + (\rho\sin\phi - \rho_s\sin\phi_s)^2 + z^2]^{\frac{1}{2}}}}{[(\rho\cos\phi - \rho_s\cos\phi_s)^2 + (\rho\sin\phi - \rho_s\sin\phi_s)^2 + z^2]^{\frac{1}{2}}}$$

where the subscript s denotes variables at the source (at the $\delta k$ region) and $\Delta z_s$ is the thickness of the quantum wells. In order to evaluate the integral in Equation 4, an expression must be found for the excess carrier distribution. Transverse carrier diffusion within the quantum wells can be modeled by:

$$\frac{\partial \rho'}{\partial t} + \frac{\rho'}{\tau} = D_a \frac{\partial^2 \rho'}{\partial \rho_s^2} + D_a \frac{1}{\rho_s} \frac{\partial \rho'}{\partial \rho_s} \qquad \text{Equation 5}$$

where $\tau$ is the recombination rate, and $D_a$ is the ambipolar diffusion coefficient.

A complete solution for the carrier distribution under these conditions would entail a treatment of carrier diffusion across the separator region. In order to capture the salient features of the process, the following solution is adopted to model the carrier distribution in the wells (approximately valid for $t > L_{sep}^2/D_a$ where $L_{sep}$ is the separator thickness, of the order of 1000 Å):

$$\rho'(\rho, t) = \frac{\zeta N_c}{4\pi D_a t \Delta z_s} e^{-t/\tau} e^{-\rho_s^2/4D_a t} \qquad \text{Equation 6}$$

where $\xi$ is the ratio of the number of carriers initially produced following the absorption of the soft x-ray photon to the number ultimately trapped in the wells. For example, in the case of a single quantum well, the ratio $\xi$ is likely to be close to unity (assuming a clean and uniform surface with low associated recombination rate). If a probe-beamdriven avalanche occurs, the ratio $\xi$ can potentially be considerably larger (10 times) than unity.

The scattering integral of Equation 4 can now be evaluated to give:

$$E_s = \frac{\xi k k_o N_{eh} N_c e^{-t/\tau}}{2\pi(\rho^2 + z^2)^{\frac{1}{2}}} e^{ik(\rho^2 + z^2)^{\frac{1}{2}}} e^{\frac{-k^2 \rho^2 D_a t}{(\rho^2 + z^2)E_i}} \qquad \text{Equation 7}$$

The intensity of the scattered light is proportional to the square of the magnitude of the electric field. An expression for the amount of scattered light as a function of the incident optical beam is:

$$\frac{I_s}{I_i} = \frac{\zeta^2 k^2 k_o^2 |N_{eh}|^2 N_c^2}{4\pi^2(\rho^2 + z^2)} e^{-2t/\tau} e^{-2k2 D_a t \sin 2\theta} \qquad \text{Equation 8}$$

Recombination in material such as GaAs is slow ($\tau$ is of the order of $10^{-9}$ sec) on the time scale of the gated optical probe pulse (if the pulse length is near 10 psec). As a result, the principal time-dependence of the scattered light comes from the exponential term in Equation 8, which arises from carrier diffusion. The characteristic angle at which scattering occurs is:

$$\theta_c = \arcsin \frac{1}{\sqrt{2k^2 D_a t}} \qquad \text{Equation 9}$$

from which the dependence of the angular divergence on time after photon absorption is made explicit. Equation 9 is plotted in FIG. 3.

From an inspection of Equation 8, one observes that wide angle scattering is dominant initially. Later, essentially all of the scattered light is nearly forward directed and would not be seen by a wide-angle (only) detector. This effect allows discrimination in time between signals from different soft x-ray photons (gating) and, in addition, allows discrimination of the scattered signal from the incident optical probe beam.

The amount of radiation scattered into an annular lens which is placed distance R away from the quantum well plane (under the above assumption that the region between substrate and lens is a perfect index-matched medium), and which accepts radiation between $\theta_1$ and $\theta_2$ is computed, as follows, by integrating $I_s$ over the area of the lens:

$$P_c = \int_0^{2\pi} d\phi \int_{\theta_1}^{\theta_2} d\theta R^2 \sin\theta I_s \qquad \text{Equation 10}$$

where $P_c$ is the collected power. After some straightforward manipulation, one obtains:

$$P_c = \qquad \text{Equation 11}$$

$$\frac{\zeta^2 k^2 k_o^2 |N_{eh}|^2 N_c^2 I_i e^{-2t/\tau}}{4\pi} \int_{\sin^2\phi_1}^{\sin^2\phi_2} \frac{e^{-\beta y}}{\sqrt{1-y}} dy$$

where:

$$\beta = 2k^2 D_a t \qquad \text{Equation 12}$$

The nonlinear factor $N_{eh}$ for the localized carrier distribution under avalanche conditions and at a bandgap of 1.45 eV is $3.7 \times 10^{-20}$—$11.2 \times 10^{-19}$ cm$^2$, assuming that the wavelength of the probe beam is 0.855 microns in free space. Also assume that the initial number of carriers in the well, $N_c$, is 500 for one x-ray photon and that an avalanche occurs which increases the number of carriers in the vicinity of the initial soft x-ray photon by a factor of five ($\zeta = 5$). With these assumptions, Equation 11 can now be evaluated to give the power of the collected light assuming perfect index matching between the lens L and the planar detector structure.

$$P_c = \qquad \text{Equation 13}$$

$$1.2 \times 10^{-13} \text{ cm}^2 \zeta^2 I_i \int_{\sin^2\phi_1}^{\sin^2\phi_2} \frac{e^{-\beta y}}{\sqrt{1-y}} dy$$

where the recombination factor has been dropped. The integral is evaluated numerically to be approximately 0.7 in the collection angles ranging from 30° to 60° for small normalized time $\beta$.

The amount of light collected at wide angles diminishes in time according to the dispersal of the localized carrier distribution. For an incident laser intensity of 20 $\mu$J/cm$^2$, around 170 photons are scattered into the collection angles. An expanded image of this signal is then constructed at the CCD detector plane. Discrimination between the weak optical signal and the main probe beam is accomplished by focusing the probe beam to a point at the lens plane, and discarding the reflected probe beam.

The scattered optical signal is weak, although detectable with commercially available CCD technology. In the presence of such a weak signal, careful attention must be given to stray optical light in a soft x-ray diagnostic instrument based on this technology. The microetalon system described in the next section produces a significantly stronger optical signal per converted soft x-ray photon. IV. Soft X-Ray Detection Using Microetalons In the microetalon embodiment (FIGS. 4–6) the x-rays are incident on microetalons in the form of an N × N array of vacuum isolated pixels 14 where each pixel 60 (assumed to be square) can be approximately 0.5 $\mu$ on a side. These pixels (enlarged in FIG. 5 and shown schematically in Fig. 6) are essentially Fabry-Perot cavities made up of multiple quantum wells 66 sandwiched between two mirrors M1 and M2 (FIG. 6). and mounted on a substrate 64. M2 is composed of $\lambda/4$ layers 62 of alternating materials, such as GaAs and AlGaAs. M1 is composed of a thin metal layer 68 that is transmissive to the x-ray photons R and yet highly reflective to the probe beam 40.

In the embodiment of FIGS. 4–6, the microetalon pixels 14 serve to isolate MQW regions (which in essence digitizes the soft x-ray signal) and substantially increases the number of optical signal photons produced per soft x-ray photon R. In addition, fast recombination of carriers occur on the side walls 63, 65 of the MQW is not present in the planar system and provides a mechanism for obtaining fast time-response.

Since the soft x-rays 52 penetrate only near the surface, a major problem arises in transporting carriers from the surface to the center of the pixels 14 where the MQWs 66 are situated. The characteristic ambipolar diffusion length for a 10 psec time response requirement is near 2000 Å, yet the distance between the top pixel surface 69 and the center of the cavity where the quantum wells are located is typically more than 5 times that distance.

This penetration problem is resolved by constructing the surface mirror M1 of material having the unusual property of transmitting soft x-rays while being highly reflective to optical radiation. Metals which exhibit troughs below L-shell or M-shell absorption edges are good candidate materials for this application. For example, aluminum has such a trough below the L edge at 73 eV in the soft x-ray regime of interest. Metals with a Cooper minimum corresponding to the energy of the incident x-ray, such as yttrium, beryllium, strontium or scandium, may also be used, as well.

For example, use of a 1200 Å thick aluminum layer for M1 would result in reflection of more than 90% of the optical light from beam 40 and absorption of less than 30% of the incident soft x-ray radiation 52. As previously mentioned, it may be necessary to add insulator material (not shown) for separation between the metal mirror layer 68 and the semiconductor MQW layer 66 to reduce carrier penetration into the optically active MQWs which are in proximity to the upper pixel surface 69.

The reflection of the optical probe beam 40 from the individual pixels 14 is strongly dependent on the complex refractive index n of the quantum well layers 66 making up the Fabry-Perot cavity and can be described by:

$$\frac{I_r}{I_i} = \frac{4r\sin^2\delta/2}{(1-r)^2 + 4r\sin^2\delta/2} \qquad \text{Equation 14}$$

where:

$$\delta = \frac{4\pi n l \cos\theta}{\lambda} \qquad \text{Equation 15}$$

where l is the thickness of the MQWs, $\theta$ is the angle of incidence of the beam 40, $\lambda$ is the wavelength of the beam, and r is the reflectivity of the cavity edges, i.e., about 93.5%. The pixels are vacuum isolated from one another so that imaging of the individual pixels yields "digitized" information about the distribution of the incident soft x-rays. Vacuum isolation may be obtained by locating the detector apparatus in a vacuum chamber. Since every pixel acts in a similar manner, it is only necessary in analyzing the device to consider the operation of a single pixel 14.

Light 36, preferably from a bright, short pulse, monochromatic source 15', such as a laser, is collimated by lens 38 and projected onto beam splitter 34 where it is divided into two beams, one of which, incident beam 41, is incident on the substrate bottom of detector 50.

X-rays 52 are incident on the top surface 69 on the other side of each pixel and generate carriers in the semiconductor material pixels 14. Once the carriers enter the multiple quantum wells 66, both the real and the imaginary parts of the refractive index of the MQws are altered. This modification changes the reflected probe beam 41 (FIG. 4) through the change in refractive index $\Delta n$ described in Equations 1 and 2. The reflected signal 42 passes through beam splitter 34 and is collected by lens 44 and processed onto an imaging device, such as a CCD 46.

The pixels 14 will reflect a small fraction of the incident photons from beam 1 in the absence of an absorbed soft x-ray photon, due to the presence of the optically active quantum wells within the Fabry-Perot cavity. Note: It is assumed that the probe beam is tuned to the long wavelength knee of the exciton absorption lines at 1.45 eV (for GaAs) in order to generate a carrier avalanche, similar to the assumptions made previously. The internal optical probe intensity is assumed, as before, to be 20 $\mu$J/cm$^2$. This requires the use of a reduced incident optical probe intensity $I_i'$; which in this case is 1.3 $\mu$J/cm$^2$).

Assume, also, as before, that the nonlinear factor $N_{eh}$ =3.7 ×10$^{-20}$ −i1.2 ×10$^{-19}$cm$^3$ at 1.45 eV, and p80

= 0.855 μ, $N_c$ = 500 and $\zeta$ = 5. Under these conditions, it is estimated that approximately 1900 signal photons are reflected for this example. This is a factor of 12 larger than the signal in the planar embodiment. As before, the primary effect comes from the modulation of the imaginary part of the index of refraction. The reflectivities corresponding to the pixel with and without excess carriers are 0.13 and 0.03, respectively.

The microetalon embodiment of FIGS. 4-6 appears to be more efficient in generating signal photons than the planar detector embodiment of FIG. 2 by a factor of about 180 (although the number of signal photons is large by a factor of 12, the incident intensity in this example is less by a factor of 15). Further optimization of the microetalons is possible through the use of smaller pixels or through improvement of surface mirror reflectivity.

The time response in this microetalon system is limited by the continued existence of the carriers in the quantum wells. Since recombination in bulk GaAs is a rather slow process, the time response of the device is limited to the diffusion to the side surface of the pixels where recombination can be much faster (especially if the side surfaces are metallized). Transverse diffusion in the wells can be described by Equations 5 and 6.

Since the pixels are isolated from each other, gaps exist in between the pixels where an incident x-ray has no effect on the probe beam. This reduces the efficiency of this scheme as compared to the planar approach. The spacing between the individual pixels should be minimized to obtain optimum efficiency.

The signal photons are diffracted both by the aperture defined by the pixel and by carrier localization within the microetalon. These effects are substantial for small submicron pixel structures, and requires a collecting lens to produce an enlarged image at the CCD plane.

IV. Summary

In summary, two x-ray detection embodiments have been described based on the nonlinear optical properties of a multiple quantum well structure, specifically a GaAs/AlGaAs MQW structure.

The two systems described use the concept of a carrier mediated soft x-ray/optical nonlinearity to detect short wavelength light.

Both systems show marked improvements in efficiency, and in spatial and temporal resolution over microchannel plate detectors. The two systems, however, have some advantages and disadvantages relative to one another. The microetalon system gives a much stronger optical signal (1900 photons) per converted soft x-ray photon than does the planar system (170 photons), although in both cases the signals are detectable. The microetalon approach is much more efficient (180 times) in converting soft x-ray photons to carriers due to limited pixel area coverage and surface mirror absorption of the microetalon system.

Both systems have the potential for fast time response, quantum efficiency and micron scale spatial resolution. X-ray signals at 162K eV will be easier to detect, because more carriers are generated at these energy levels.

EQUIVALENTS

Those skilled in the art will recognize, or be able to ascertain employing no more than routine experimentaion, many equivalents to the specific structures, steps, functions and materials described specifically herein, and such equivalents are intended to be encompassed within the scope of the following claims. For example, while the invention has been illustrated with GaAs/AlGaAs MQW material, other III-V semiconductor material or alloys having different bandgaps may be substituted therefore, such as the III-V compounds listed below:

| III-V | Bandgap 300K | (eV) 0K |
|---|---|---|
| AlSb | 1.58 | 1.68 |
| GaP | 2.26 | 2.34 |
| InSb | 0.17 | 0.23 |
| InAs | 0.36 | 0.42 |
| InP | 1.35 | 1.42 |

Moreover, II-VI or IV-VI material, such as CaSe, CdS, CdTe, ZnO, ZnS, PbS or PbTe, may also be readily adapted by those skilled in the art for use as detector material. The detector of the invention is optimally intended for operation in the soft x-ray range of about 50 to 3K eV, but may be readily adapted to extend below or above that range. The probe beam is preferably generated by a pulsed coherent laser operating in the wavelength of the detector material.

We claim:

1. Apparatus for detecting x-ray photons comprising:
   (a) a first means responsive to said photons for generating carriers in response to said photons;
   (b) a second means responsive to said generated carriers and having an index of refraction which changes in relation to the number of such carriers incident on said second means;
   (c) a light beam incident on said second means, said beam being modulated by said changes; and
   (d) imaging means responsive to said light means for displaying the modulations of said light beam.

2. The apparatus of claim 1 wherein the second means comprises a quantum well structure.

3. The apparatus of claim 2 wherein the quantum well structure is comprised of at least one lossy quantum well.

4. The apparatus of claim 2 wherein the quantum wells are formed of III-V compound material.

5. The apparatus of claim 1 wherein said first means comprises an impurity doped semiconductor or insulator converter body and said second means comprises a quantum well structure.

6. The apparatus of claim 5 further including third means between said first and second means for separating said first and second means to enable carriers generated in said first means to thermalize before entering said second means.

7. The apparatus of claim 1 wherein said first and second means cmprises a Fabry Perot cavity formed by a first mirror which is partly light reflective and x-ray photon transmission and a second mirror comprised of quarter wavelength films with a MQW between said mirrors.

8. The apparatus of claim 7 wherein a plurality of such cavities are formed into a pixel array on a substrate with each pixel separated from each other pixel by a vacuum.

9. Apparatus for detecting x-ray photons comprising:
   (a) a first means responsive to said photons for generating carriers in response to the number, location and photon energy of photons incident on said first means;

(b) a second means responsive to said generated carriers and having an index of refraction which changes in response to the number of such carriers incident on said second means;

(c) a pulsed light beam incident on said second means for being scattered and modulated by said changes; and (d) imaging means responsive to said pulsed light beam means for displaying the modulations of said pulsed light means.

10. The apparatus of claim 9 wherein the imaging means comprises a lens for collimating the scattered light beam and imaging said beam on a (CCD) charge-coupled-diode device.

11. A method for detecting and imaging x-ray photons comprising the steps of:

(a) subjecting a carrier generating body to said photons to generate carriers in response to said photons;

(b) subjecting a detector body to said generated carrieres; said detector body having an index of refraction which changes in accordance with the density of the generated carriers within the detector body;

(c) subjecting said detector body to a light beam; which beam is modulated by the index of refraction changes resulting from the changes in carrier density produced by said generated carriers; and (d) displaying said modulated light beam on an imaging device.

12. The method of claim 11 wherein the light beam is a coherent pulsed laser light beam.

13. The method of claim 11 wherein the portion of the light beam is scattered by said index of refraction changes and is collimated by a lens and focused on said imaging device and the unscattered portion of the light beam is stopped by a beam stopper device.

14. The method of claim 11 wherein the light beam impinges on said detector body from a side opposite a side to which the detector body is subjected to generated carriers and is reflected therefrom.

15. The method of claim 14 wherein the detector body is formed of a plurality of pixels isolated from one another.

* * * * *

UNITED STATES PATENT AND TRADEMARK OFFICE
CERTIFICATE OF CORRECTION

PATENT NO. : 4,873,439

DATED : Oct. 10, 1989

INVENTOR(S) : Peter L. Hagelstein and Cristopher C. Eugster

It is certified that error appears in the above—identified patent and that said Letters Patent is hereby corrected as shown below:

Col. 12, line 57, delete "cmprises" and insert ---comprises---.

Col. 12, line 59, delete "transmission" and insert ---transmissive---.

Col. 13, line 22 continued on line 23, delete "carrieres" and insert ---carriers---.

Signed and Sealed this

Eighteenth Day of September, 1990

Attest:

HARRY F. MANBECK, JR.

Attesting Officer

Commissioner of Patents and Trademarks